(12) United States Patent
Brott et al.

(10) Patent No.: US 7,209,850 B2
(45) Date of Patent: Apr. 24, 2007

(54) ACTIVE TESTER FOR VEHICLE CIRCUIT EVALUATION

(75) Inventors: Alejandro P. Brott, Chicago, IL (US); Dennis Thibedeau, Franklin, WI (US)

(73) Assignee: Snap-On Incorporated, Kenosha, WI (US)

(*) Notice: Subject to any disclaimer, the term of this patent is extended or adjusted under 35 U.S.C. 154(b) by 31 days.

(21) Appl. No.: 10/909,367

(22) Filed: Aug. 3, 2004

(65) Prior Publication Data
US 2006/0031035 A1    Feb. 9, 2006

(51) Int. Cl.
G01R 27/28 (2006.01)
G01R 31/00 (2006.01)
G01R 31/14 (2006.01)
G06F 19/00 (2006.01)

(52) U.S. Cl. ............... 702/117; 324/426; 324/425; 324/398; 439/762; 702/63; 702/64

(58) Field of Classification Search ............ 702/117
See application file for complete search history.

(56) References Cited

U.S. PATENT DOCUMENTS

| | | | |
|---|---|---|---|
| 6,313,608 B1 | 11/2001 | Vaeghese et al. | |
| 6,329,793 B1 | 12/2001 | Bertness et al. | |
| 6,771,073 B2 | 8/2004 | Henningson et al. | |
| 2003/0017753 A1* | 1/2003 | Palmisano et al. | 439/762 |
| 2003/0038637 A1* | 2/2003 | Bertness et al. | 324/426 |
| 2004/0036443 A1 | 2/2004 | Bertness | |

OTHER PUBLICATIONS

U.S. Appl. No. 10/619,187, filed Jul. 15, 2003.

* cited by examiner

Primary Examiner—John E. Barlow, Jr.
Assistant Examiner—Sujoy Kundu
(74) Attorney, Agent, or Firm—McDermott Will & Emery LLP

(57) ABSTRACT

An active tester for vehicle circuit evaluation includes a signal source for generating a dynamic signal, such as an AC current, for injecting to a circuit under test. The tester includes a data storage device for storing at least one test parameter and a data processor for processing data. In operation, the data processor controls to apply the dynamic signal to the separated points of the circuit via the first set of terminals. The response of the circuit under test to the applied dynamic signal is measured. The data processor determines a dynamic parameter of the circuit under test as a function of the dynamic signal and the response. The data process then generates a test result related to the characteristics of the circuit as a function of the at least one test parameter and the determined dynamic parameter. The test result is compared with specification values to determine whether the circuit under test works normally.

71 Claims, 5 Drawing Sheets

ACTIVE TESTER FOR VEHICLE CIRCUIT EVALUATION

RELATED APPLICATIONS

This application relates to copending U.S. patent application Ser. No. 10/619,187, filed Jul. 15, 2003 and titled TESTING AND DISPLAY OF ELECTRICAL SYSTEM IMPEDANCE, the disclosure of which is incorporated herein by reference in its entirety.

TECHNICAL FIELD

The present disclosure relates to circuit testing, and more particularly, to an active method and system for determining the health of a vehicle circuit, even when no current or voltage has been established by the operation of the circuit.

BACKGROUND

In the automotive industry, it has been a known practice to evaluate the health of starting and/or charging circuit components by measuring a voltage drop corresponding to a specific input current between two separate points of the circuit, and comparing the measurement with specification values. For instance, for determining the health of a starting circuit (which may include a starter, a battery, a solenoid, cables and terminals) in an automotive vehicle, a technician is often asked to use a voltmeter to measure a voltage drop between the positive terminal of the starter and the positive terminal of the vehicle's battery while the starter is cranking the engine. This can be a cumbersome task, sometimes requiring an additional technician to monitor the voltage display while the other technician cranks the vehicle at the same time. If the current flowing through to the starter is normal, the measured voltage drop will be within an acceptable range specified by the manufacturer. If an abnormal voltage drop is found, further investigation may be needed to determine the cause of the abnormality. For example, a possible cause to the abnormal voltage drop may be that the resistance or impedance of a cable connecting the starter and battery is too high. In order to isolate the source of the problem, the technician needs to remove the connecting cable from the starting circuit and uses an ohmmeter to measure the resistance of the cable to determine whether the cable resistance indeed contributes to the abnormal voltage drop. If the cable resistance is normal, the technician will then check the integrity of the connections of the cable terminals to the starter and the cable to the battery. Rust and corrosion are common problems with the terminal connections of the cable which add unwanted resistance to this circuit.

For determining the health of a charging circuit (which includes a battery charged by an alternator, and cables and terminals) in an automotive vehicle, a technician often is asked to use a voltmeter to measure a voltage drop between the positive terminal of the alternator and that of the battery charged by the alternator when the charging circuit is in operation, i.e., a current generated by the alternator is flowing through the battery, to determine whether the measured voltage drop falls within an acceptable range specified by specifications. If an abnormal voltage drop is found, further investigation may be needed to determine the cause of the abnormality. For example, a possible cause to the abnormal voltage drop may be that the resistance or impedance of a cable connecting the alternator and battery is too high. In order to isolate the source of the problem, the technician needs to remove the connecting cable from the charging circuit and uses an ohmmeter to measure the resistance of the cable to determine whether the cable resistance indeed contributes to the abnormal voltage drop.

A shortcoming of the conventional approach is that the multiple steps for measuring the voltage drop and work involved to measure the cable resistance add complexity to the testing procedure and it can be time consuming, thus adding additional expense to the repair cost. Furthermore, the conventional approach requires the starting circuit or charging circuit to be in operation, such that a voltage drop can be measured by the voltmeter. However, the circuit under test is not always in working condition or in operation. In that case, no current is flowing through the circuit, and no voltage drop can be detected by the voltmeter. As a result, the test cannot be performed. Moreover, the specification of a vehicle may require comparing voltage drops using different testing parameters, such as varying starter currents under different engine conditions or different charging currents under different loads.

The starter current can vary depending on temperature and the engine's operating condition. However, it is not always possible to generate or duplicate the required testing parameters as required by the specification. Even if it is possible, it is burdensome to perform multiple tests using various test parameters.

Therefore, a need exists for a tester that would reduce the complexity of circuit testing procedures. There is also a need for a tester that could determine the health of circuits even if the circuits are not in operation or working condition. Another need exists to allow a user to predict circuit responses corresponding to different testing parameters, without the need to actually conduct multiple tests using the different testing parameters.

SUMMARY OF THE DISCLOSURE

This disclosure presents testers that provide various advantages and address some or all of the above-identified needs as well as other needs. The advantages, operations and detailed structures of the disclosed testers will be appreciated and understood from the following descriptions.

An exemplary tester of this disclosure includes a data processor and a data storage device for storing at least one test parameter under which a circuit may be tested, such as one or more current values. The tester further includes a signal source for generating a dynamic signal. A dynamic signal as used throughout this disclosure refers to a signal with varying amplitude, such as an AC current signal. The amplitude may vary in a fixed, changing, or infinite frequency, or a combination of multiple frequency components. It is understood that a DC signal is also a type of dynamic signal as the amplitude of a DC signal varies at a fixed frequency, which is zero.

During test, the dynamic signal is applied to a circuit under test between separated points. The response of the circuit to the applied dynamic signal is obtained from the separated points or using other signal gathering means. The data processor calculates a dynamic parameter of the circuit between the separated points as a function of the applied dynamic signal. A dynamic parameter is any parameter of a circuit that is a function of an applied dynamic signal. For instance, a dynamic parameter may be the impedance of a circuit in response to an applied AC current signal. The data processor accesses the at least one test parameter stored in the data storage device and generates a test result related to the characteristics of the circuit between the separated points as a function of the at least one test parameter and the determined dynamic parameter.

In one embodiment, the tester includes an AC current source for generating an AC current signal, which is applied to the circuit under test. A voltage drop between the separated points caused by the AC current signal is measured. The tester than determines the impedance of the circuit by applying Ohm's law to the AC current and the measured voltage drop. The tester may include a memory device, such as Flash ROM, that stores one or more test parameters, such as one or more DC or AC current values. In one embodiment, the tester predicts voltage drops in response to the DC or AC current values by applying Ohm's law to the determined impedance and the stored DC or AC current values. In one aspect, one of the one or more DC or AC current values is the actual DC or AC current flowing through the circuit between the separated points when the circuit is in operation.

According to another embodiment, the tester stores a plurality of test parameters, and allows a user to select one or more test parameters among the stored parameters. In response to the selection, the tester generates a test result for each of the selected test parameters.

In another embodiment, the tester has access to specification data of the circuit under test, stored locally or remotely, and compares the test result with the specification data to determine whether the characteristics of the circuit comply with the specification. For example, the tester may establish signal communication with other data processing systems, such as computers, via wired or wireless signal links. If the circuit is part of a car, a technician may enter the vehicle identification number (VIN) of the vehicle, which includes embedded information identifying the model year of the vehicle. In one embodiment, the tester obtains information related to a vehicle and/or circuits there of from an in-car signal port, such as OBD or OBD-II port, via wired or wireless signal communications. Based on this information, the tester sends out a request to a server coupled to the tester for specifications related to the circuit. In response to the request, the server and/or computers coupled to the server gather the requested specification data and send it to the tester. The specification data may include information related to acceptable voltage drops of a specific circuit corresponding to different currents. For instance, the specification may indicate that a voltage drop between the positive terminals of an alternator and a battery should fall between 0.10–0.15 volts when a DC current at 100 ampere is applied to the circuit.

A beneficial aspect of a tester according to this disclosure is provided by using an included signal source for conducting the test. A test result can be obtained even if the circuit under test is not in operation. A further beneficial aspect of a tester according to this disclosure is the ability of the tester to provide test results for different test parameters without the need to actually conduct multiple tests using different test parameters.

Additional advantages of the present disclosure will become readily apparent to those skilled in this art from the following detailed description, wherein only the preferred embodiment is shown and described, simply by way of illustration of the best mode contemplated. As will be realized, the disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of the present disclosure. It will be apparent, however, to one skilled in the art that the present method and system may be practiced without these specific details. In other instances, well-known structures and devices are shown in block diagram form in order to avoid unnecessarily obscuring the present disclosure. For illustration purpose, the following examples describe the operation of an exemplary tester used for evaluating a circuit of an automotive vehicle. It is understood that the use of tester is not limited to vehicle circuits. The tester also can be used in other types of electrical circuits.

Figure 1:
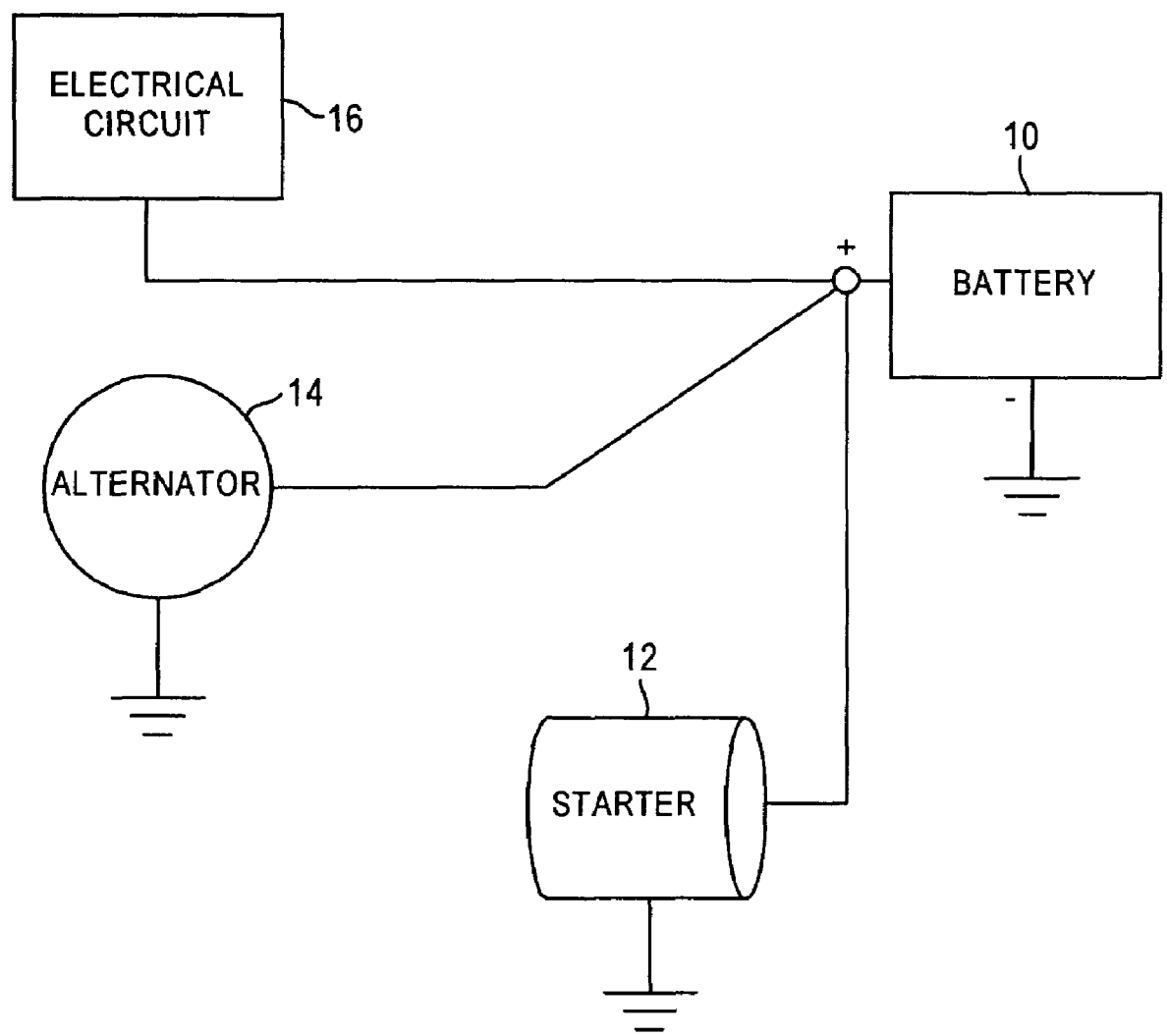
FIG. 1 is a block diagram broadly illustrative of a typical vehicle system circuit.

FIG. 1 is a generalized block diagram of a vehicle electrical system. Battery 10, starter 12 and alternator 14 are shown connected in parallel for simplicity of illustration. An auxiliary test terminal also may be provided to permit easier access for connection to circuitry under test, such as the positive battery terminal. Electrical circuit 16 represents in general the remaining electrical elements and circuitry that draw current from the battery, including, for example, voltage regulator, radio, headlights, etc. Although shown as a block diagram also connected in parallel with the battery, it is understood that various series interconnections exist that are well known vehicle electrical circuit interconnections. Test leads of a tester, to be more fully described below, may be applied to the terminals of these devices individually or across any points in the electrical system.

Figure 2:
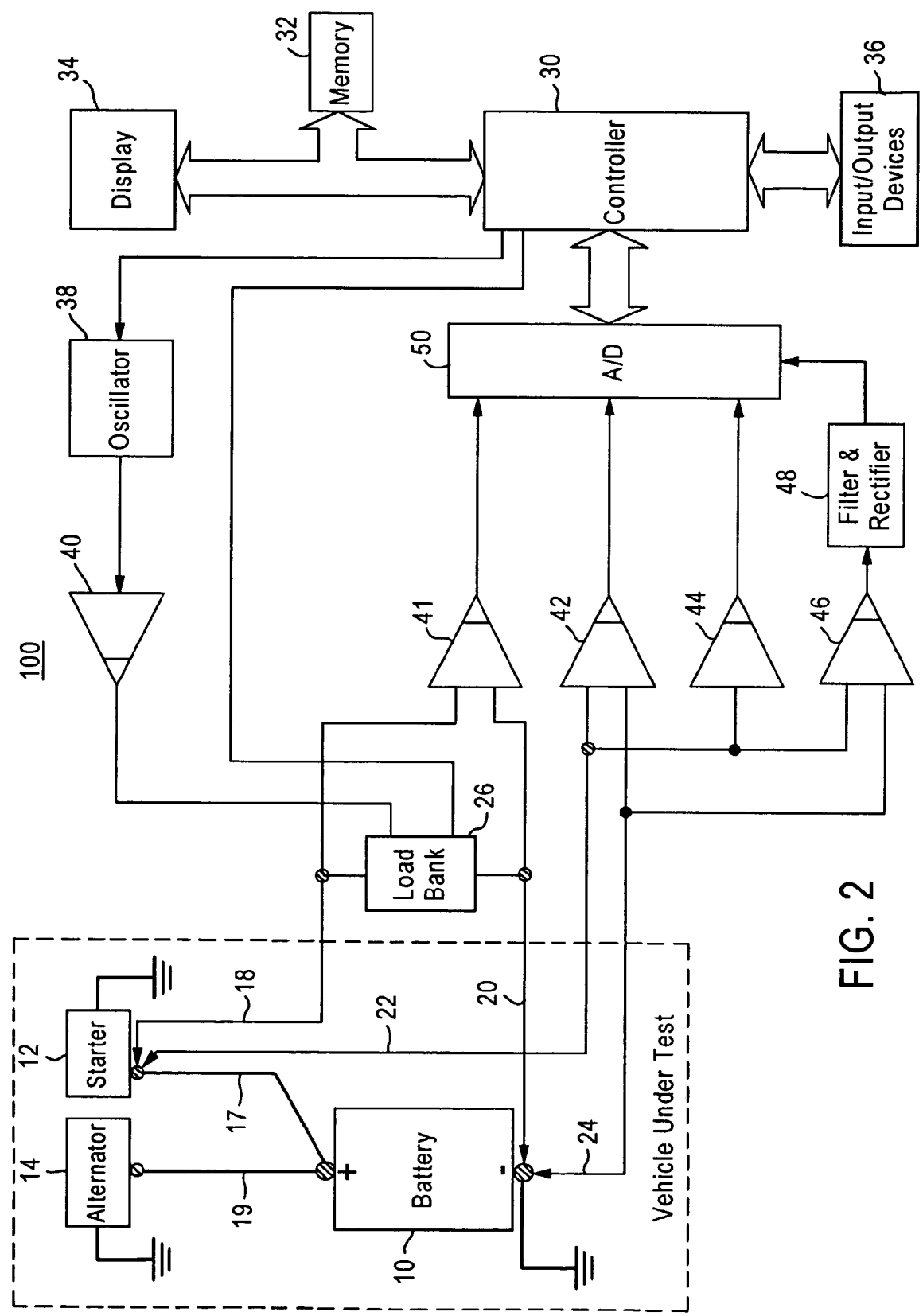
FIG. 2 is a schematic diagram of a tester in accordance with the present disclosure.

FIG. 2 depicts an exemplary tester 100 of the present disclosure along with circuits in an automotive vehicle. By way of example, the structure and operation of tester 100 is explained using examples of testing characteristics of an alternator/battery connection or a starter/battery connection in an automotive vehicle. It is understood that tester 100 may be used in other types of circuits.

Alternator 14 and battery 10 are connected by a connecting cable 19, and starter 15 and battery 10 are connected by a connecting cable 17. While the tester is shown connected between the negative terminal of battery 10 and positive terminal of starter 15, in operation testing may progress to various other circuits or other connection points.

For an alternator/battery circuit in an automotive vehicle, one of the requirements specified by the specification is a value or a range of a permissible voltage drop, Vdrop, between the positive terminals of battery 10 and alternator 14, corresponding to one or more current values. If the difference between Vdrop and the specification value exceeds a predetermined threshold, it is determined that the circuit does not operate properly.

Tester 100 incorporates a four point connection, known as a Kelvin connection, to the circuit points under test. A Kelvin style lead set allows two independent signals to be transferred to a device under test without affecting one another. A conventional Kelvin lead set has a 4-wire connection with two separate pairs of conductors. A load signal can be applied with one set of conductors while the other set measures a precise voltage measurement at the same point at which the load is applied to the device under test. Tester 100 may also utilize other types of connection configurations with different numbers of terminals and/or signal leads.

The four points of connection are made by a pair of load leads 18 and 20 and a pair of sense leads 22 and 24. Across the load leads is a load bank 26 that may comprise one or more resistors selectively inserted under the direction of a data processor of tester 100, such as controller 30. Controller 30 may communicate with memory 32 and display 34 in conventional manner.

Display 34 may comprise an LCD device or other display devices. Input and output devices, shown generically at block 36, provide data input to controller 30 or transmission of data from controller 30. Examples of input/output devices 36 include keyboard, key pads, touch pads, control sticks, scroll balls, control buttons, touch screens, voice recognitions, communication ports for communicating with other data processing devices, and so on, and any combination thereof.

Memory 32 may include one or more types of data storage devices, such as a random access memory (RAM) or other dynamic storage device, a read only memory (ROM) or other static storage device like a magnetic disk or optical disk, and so on. In one embodiment, memory 32 stores specification data related to detailed, exact statement of particulars of circuits under test, such as pre-established thresholds for a voltage drop between the positive terminals of alternator 14 and battery 10 in response to one or more current values. Testing results and analyses may be transmitted from controller 30 to memory 32 for storage and/or to another device via an external data link (not shown in FIG. 2).

The circuit connection points under test may be loaded by application of a dynamic signal, such as an AC current I, to load bank 26 via a dynamic signal source, such as oscillator 38, and voltage-to-current converter 40. In one embodiment, tester 100 provides an AC current source to apply an AC current to the circuit under test. A dynamic signal as used throughout this disclosure refers to a signal with varying amplitude, such as an AC signal. The amplitude may vary in a fixed or changing frequency, a combination of multiple frequency components, or an infinite frequency.

Current sense amplifier 41, connected across the load bank 26, outputs a signal to an input of one channel of A/D converter 50. Connected to the sense leads 22 and 24 are DC volt amplifier 42, alternating current ripple amplifier 44 and AC voltage amplifier 46, the output of the latter applied to filter and rectifier 48. Each of these amplifiers provides an output to a respective channel input of A/D converter 50. The signals provided by these inputs are utilized by controller 30 for processing.

During test, a technician attaches sense leads 22, 24 and load leads 18, 20 to two selected separated points of a circuit under test. For instance, in order to determine whether a voltage drop between the positive terminals of alternator 14 and battery 10 corresponding to a specific current complies with the specification, the technician may attach sense leads 22, 24 and load leads 18, 20 to positive terminals of alternator 14 and battery 10. Controller 30 controls to apply the AC current signal I to the terminals. The response of the circuit under test to the applied AC current signal I is obtained from the positive terminals by sense leads 22, 24, in the form of a voltage drop V. The obtained voltage drop V is passed through DC volt amplifier 42 and applicable analog-to-digital converter circuits, to controller 30.

After controller 30 receives the circuit response (voltage drop V) to the applied AC current signal I, controller 30 determines a dynamic parameter of the circuit under test based on voltage drop V and the applied AC current signal I. A dynamic parameter as used in this application is any parameter of a circuit that is a function of an applied dynamic signal. For instance, a dynamic parameter may be the impedance of the circuit between the separated points in response to the applied AC current signal I. For instance, controller 30 determines the impedance Z between the positive terminals of alternator 14 and battery 10 by applying Ohm's law:

$$\text{Impedance } Z = V/I \qquad \text{Eq. (1)}$$

wherein I is the applied AC current and V is the voltage drop between the positive terminals of alternator 14 and battery 10 responsive to the applied AC current I.

Figure 3:
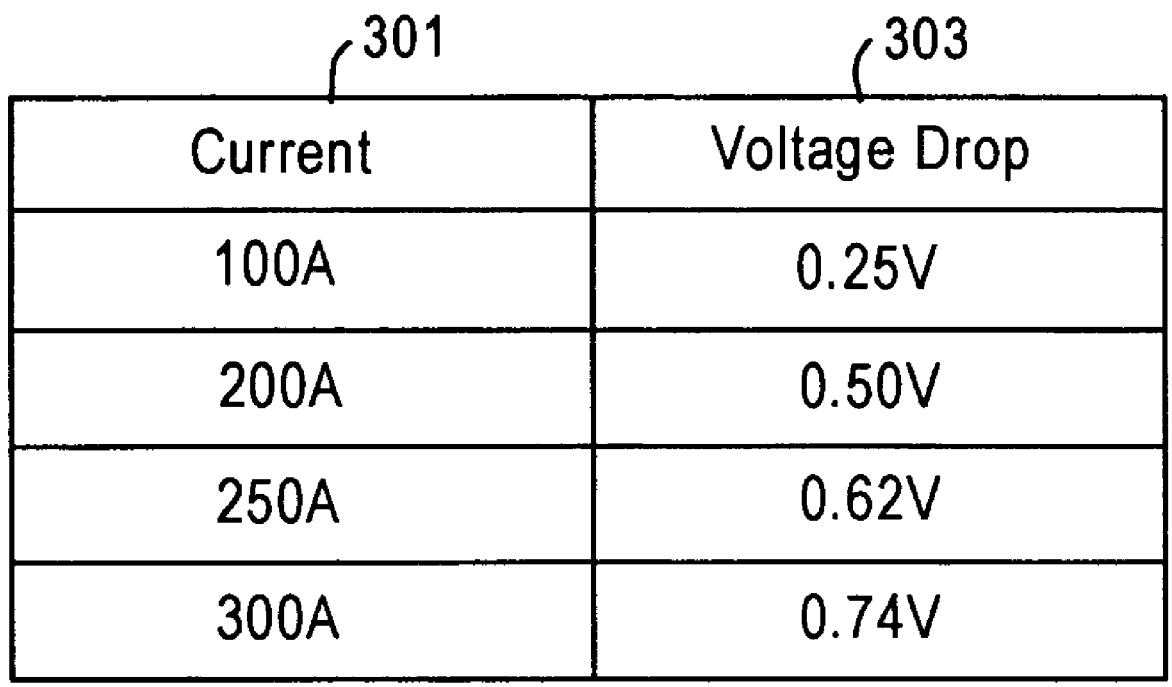
FIG. 3 shows an exemplary data structure of specification data.

As discussed previously, the specification of the alternator/battery circuit specifies a required voltage drop Vdrop between the positive terminals of alternator 14 and battery 10, responsive to different current values. An example of the specification is shown in FIG. 3, in which data field 301 specifies values of currents that can be applied to circuits under test, and data field 303 specifies values of voltage drops corresponding to the applied currents in data field 301. The specification data may be stored in memory 32 and/or an external data storage system that is accessible by controller 30 via a data link, such as the internet.

In order to retrieve specification for the circuit under test, a technician may enter the vehicle identification number (VIN) of the vehicle, which includes embedded information identifying the model year of the vehicle. Based on this information, tester 100 sends out a request to a server coupled to the tester or accesses memory 32 for specifications related to the circuit. In response to the request, the server gathers the requested specification data and sends it to tester 100. In one embodiment, tester 100 obtains vehicle information by establishing signal communication with a signal port of the vehicle, such as the OBD-II port.

Memory 32 stores a set of test parameters under which a circuit can be tested. In one embodiment, memory 32 stores current values corresponding to those specified in column 301. Controller 32 predicts the voltage drop Vdrop between positive terminals of alternator 14 and battery 10 in response to the current values listed in column 301, by using the following equation:

$$V\text{drop} = I\text{test} \times Z \qquad \text{Eq. (2)}$$

wherein Itest represents each of the current values and Vdrop is the predicted voltage drop corresponding to each of the current values Itest.

After the predicted voltage drop Vdrop for each current value is determined, controller 30 compares the predicted voltage drop Vdrop with the specification values specified in column 303 in FIG. 3. If the difference between the predicted voltage drop Vdrop and the specification value exceeds a predetermined threshold, controller 30 generates a diagnostic result, such as a visual and/or audio indication, indicating that the circuit did not pass the test. In one embodiment, the diagnostic result indicates whether a connection condition of the alternator/battery circuit is normal, such as by generating a visual result. The connection condition may include, but not limit to, connections between cable and terminals of alternator or battery, mounting corrosions, terminal rust, ground conditions, cable conditions, etc. Based on the diagnostic result, the technician may proceed to check whether various connection conditions are normal, as known in the automotive service industry.

A similar test can be performed on the starting circuit using similar approaches as discussed relative to the alternator/battery circuit to determine connection conditions of the starting circuit.

Apparently, by using tester 100, it is not necessary to actually subject the circuit to various test parameters as required by the specification. Rather, tester 100 provides predictions of circuit response to each of the test parameters (the various current values as in the above example) without the need to actually apply different currents to the circuit under test. Therefore, test procedures are simplified and test efficiency is improved.

According to another embodiment, tester 100 prompts a user to enter or select one or more test parameters, such as different current values, to determine a predicted voltage drop Vdrop for each of the entered or selected test parameters. According to another variation, tester 100 calculate a voltage drop between the positive terminals of alternator 14 and battery 10 based on the calculated impedance Z and an actual current passing the positive terminals of alternator 14 and battery 10. The actual current can be measured by using a current measurement means, such as a non-contact current probe like Hall-effect sensors. Tester 100 can then calculate and present the test result to the user by applying the actual current and the calculated impedance to equation (2).

In one embodiment, memory 30 also stores specification data related to the required impedance between the positive terminals of alternator 14 and battery 10. If controller 30 determines that the circuit under test to be abnormal, controller 30 compares the impedance calculated that equation (1) with that specified in the specification. If the difference between the calculated impedance and the specification exceeds a predetermined threshold, controller 30 generates an output indicating that the impedance may be a cause of the abnormality. Otherwise, controller 30 generates an output indicating that the impedance of the circuit is normal, and that the cause of the abnormality may be from other portions of the circuit. With such information, the technician does not need to recheck the impedance again, which usually involves additional steps of disconnecting cable 19 from the terminals and measuring the impedance of cable 19 to determine whether it complies with the specification. According to another embodiment, tester 100 has access to an expert database including information related to possible causes and check points for different symptoms. By accessing the expert database, tester 100 guides the technician to go through a step-by-step check to determine the cause of the abnormality.

It is to be noted that the term "impedance" is used throughout this disclosure in a generic sense and may encompass resistance, conductance and admittance characteristics, which are directly related to impedance, whenever applicable. It is to be understood that the results obtained by tester 100, although described as impedance values, may be expressed in terms of conductance or admittance as well as, or in lieu of, impedance.

For instance, instead of calculating the impedance of the circuit under test, tester 100 may calculate the admittance Y between the positive terminals of alternator 14 and battery 10 by using the following equation:

$$\text{Admittance } Y = I/V \qquad \text{Eq. (3)}$$

wherein I is the applied AC current and V is the measured voltage drop between the positive terminals of alternator 14 and battery 10 responsive to the applied AC current I. It is known that admittance Y is the reciprocal of impedance Z. Thus, tester 100 may determine voltage drops corresponding to different current values by using the following equation:

$$V\text{drop} = I\text{test}/Y \qquad \text{Eq. (4)}$$

wherein Itest represents each current value specified in the specification and Vdrop is the predicted voltage drop corresponding to each current value Itest. Tester 100 can then diagnose whether the circuit under test is normal by comparing the determined voltage drop with the specification, as described earlier.

Although the above discussions describe the examples by using impedance, conductance, voltage drops, etc., it is understood that many variations are available to tester 100 without departing from the disclosure, such as using different combinations of current, voltage, conductance, impedance, etc. For example, instead of specifying the required voltage drops corresponding to different current values, the specification for one type of circuit may specify required current values corresponding to various applied voltage sources. In that case, tester 100 may store various desired test voltage values and generate predicted response currents as a function of the various voltage values and the calculated impedance or conductance.

Tester 100 may use different terminal/signal lead configuration based on the types of signals used in testing circuits. For example, if the applied dynamic signal is an AC voltage signal and the response of the circuit to be measured is the current response thereof, tester 10 may include a set of leads for applying an AC voltage signal to a circuit under test, and using a non-contact current sensor, such as a Hall-effect sensor, to obtain the current response of the circuit to the applied AC voltage. Thus, rather than using a four point connection as illustrated previously, a connection configuration other than a four-point connection can be used.

Figure 4A:
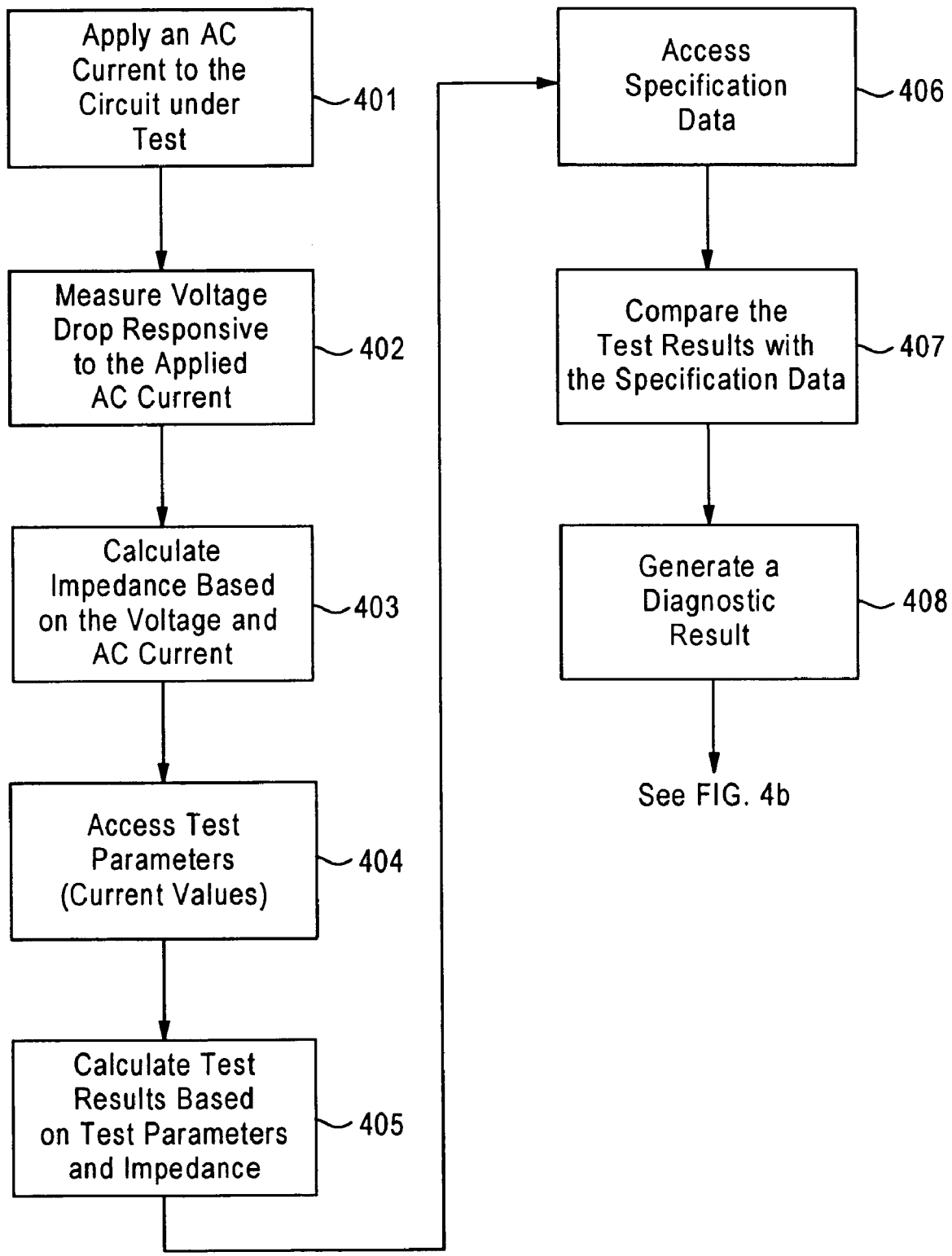
FIGS. 4a and 4b are flow charts illustrative of an exemplary operation of a tester according to this disclosure.
Figure 4B:
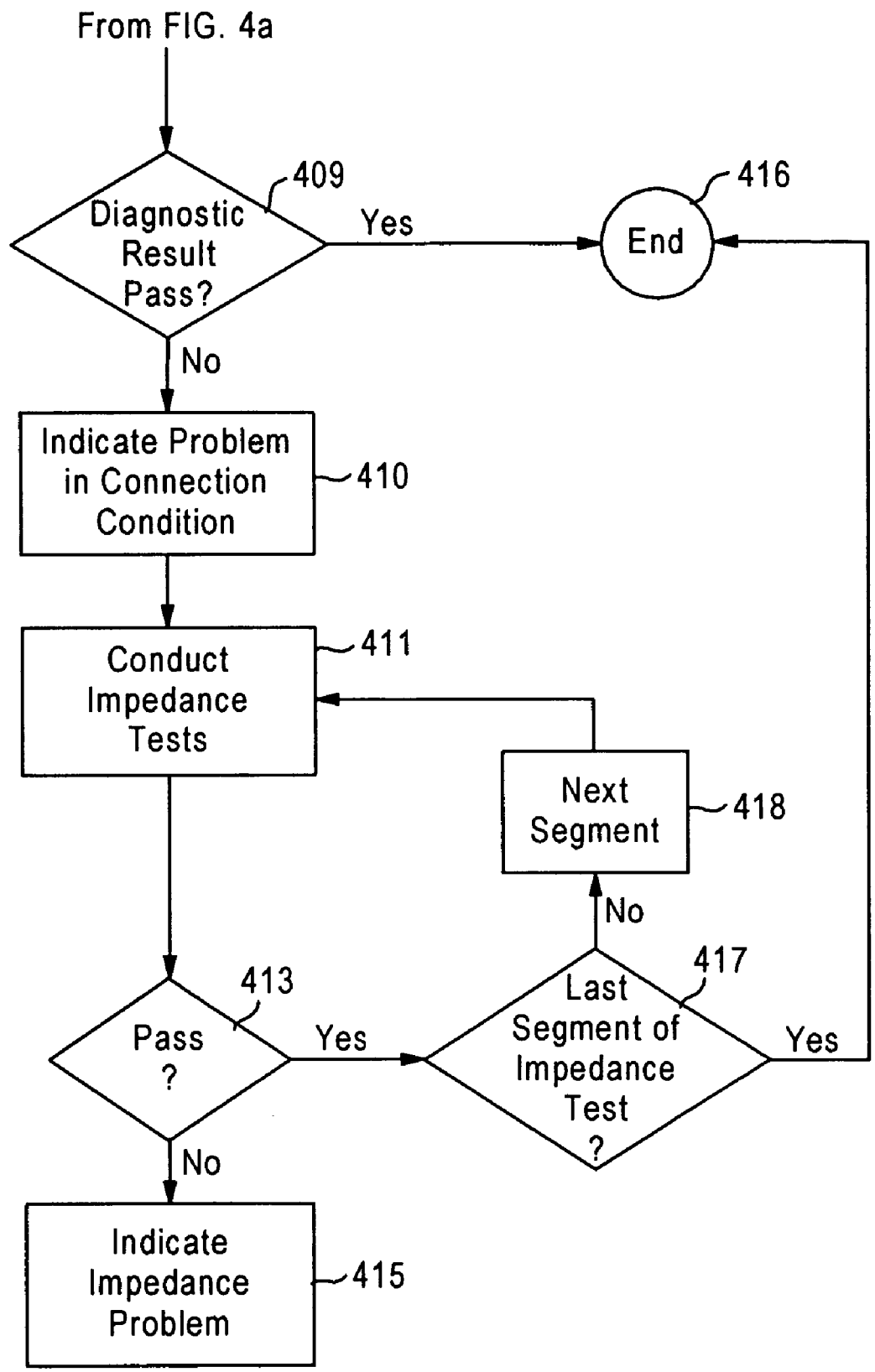

FIGS. 4a and 4b are flow charts illustrating an exemplary operation of tester 100. At step 401, tester 100 applies an AC current to positive terminals of alternator 14 and battery 10. A voltage drop between the terminals is measured at step 402. At step 403, tester 100 calculates the impedance of the circuit based on the applied AC current and the measured voltage drop. Tester 100 has access to test parameters, such as current values, and calculates test results, such as a voltage drop, corresponding to each current value (steps 404 and 405). The specification data may be retrieved based on information regarding a vehicle or the circuit under test. At steps 406 and 407, tester 100 accesses specification data and compares the test results with the specification data. If the difference between the test result and the specification value does not exceed a predetermined threshold, tester 100 determines that the circuit under test passes the test, and the test process ends (steps 409 and 416).

On the other hand, if the difference between the test result and the specification value exceeds the predetermined threshold, tester 100 determines that the circuit under test has failed the test and indicates that there are some problem with the connection condition between the positive terminals of alternator 14 and battery 10 (step 410). In order to further verify the cause of the abnormality, tester 100 prompts the user to conduct further impedance test along the connection path between alternator 14 and battery 10, to isolate possible causes contribute to the failed test (Step 411). For example, the user may use tester 100 to determine the respective impedance of different portions or segments of the connection path between the positive terminals of battery 10 and alternator 15, to determine if the respective impedance is acceptable based on specifications. If any of the impedance value is determined as abnormal, tester 100 indicates that the abnormal impedance is the reason for the failed test (Steps 413 and 415). Otherwise, tester 100 prompts the user to continue to conduct impedance test on other portions of the connection path to determine whether any impedance thereof complies with impedance values specified in the specification (Steps 413, 417, 418).

For instance, the user may use tester 100 to measure the impedance of the positive terminal and other connection means, such as screws, of battery 10. Tester 100 then compares the determined impedance with specification values to determine whether the measured impedance is acceptable. If the measured impedance exceeds a prescribed range of the specification impedance value, tester 100 determines and indicates that the abnormal impedance at the measured area contributes to the failed test. The user may take necessary measures to correct the problem as known to people skilled in this field.

If the measured impedance is within a prescribed range of the specification value, tester 100 determines that the impedance is normal, and prompts the user to proceed to measure impedance for the next portion of the connection path between the positive terminals of battery 10 and alternator 14, such as measuring the impedance between two connectors of cable 19 or the positive terminal of terminal and other connection means, such as screws, of alternator 14, in order to determine which portion of the connection path contributes to the failed test result.

In one embodiment, tester 100 requires or prompts the user to complete impedance test fro every portion of a connection path, even after a portion of the connection path is determined to have abnormal impedance. This is to determine whether multiple abnormal impedance exists in the connection path.

In one embodiment, tester 100 applies a dynamic signal to the alternator/battery circuit by utilizing the power supplied by battery 10. Controller 30 controls the coupling of load bank 26 to the alternator/battery via a switch and oscillator 38. The on/off of the switch is synchronized to an output of oscillator 38, such that an AC signal is effectively applied to the alternator/battery circuit via the periodic coupling of load bank 26 to the battery. In this case, tester 100 first couples to the positive and negative terminals of battery 10 for determining the impedance therebetween. The impedance between the terminals of battery 10 is recorded and set as reference impedance for later use. Then sense lead 22 and load lead 18 are moved to the positive terminal of alternator 14. Sense lead 24 and load lead 20 continue to couple to the negative terminal of battery 10. Tester 100 then measures the impedance between the positive terminal of alternator 14 and the negative terminal of battery 10. Tester 100 then determines the impedance between the positive terminals of alternator 14 and battery 10 by subtracting the reference impedance obtained earlier from the impedance between the positive terminal of alternator 14 and the negative terminal of battery 10. The result is the impedance between the positive terminals of alternator 14 and battery 10. Detailed process for using the power supplied by a battery to determine impedance between various points of a circuit coupling to the battery is discussed in U.S. patent application Ser. No. 10/619,187, filed Jul. 15, 2003 and titled TESTING AND DISPLAY OF ELECTRICAL SYSTEM IMPEDANCE, which is incorporated by reference previously.

In another embodiment, a tester according to this disclosure couples to a circuit between two separated points, and determines the impedance therebetween. The tester then compares the determined impedance with prestored specification information related to acceptable impedance values of the circuit between the separated points. If the difference between the determined impedance and the specification values exceeds a predetermined threshold, then the tester indicates that a connection condition of the circuit does not pass the test.

The embodiments described herein may include or be utilized with any appropriate voltage source, such as a battery, an alternator and the like, providing any appropriate voltage, such as about 12 volts, about 42 volts and the like. The embodiments may be used with any desired system or engine. Those systems or engines may comprise items utilizing fossil fuels, such as gasoline, natural gas, propane and the like, electricity, such as that generated by battery, magneto, solar cell and the like, wind and hybrids or combinations thereof. Those systems or engines may be incorporated into other systems, such as an automobile, a truck, a boat or ship, a motorcycle, a generator, an airplane and the like.

It is intended that all matter contained in the above description and shown in the accompanying drawings shall be interpreted as illustrative and not in a limiting sense. It is also to be understood that the following claims are intended to cover all generic and specific features herein described and all statements of the scope of the various inventive concepts which, as a matter of language, might be said to fall there-between.

What is claimed is:

1. A tester for testing a circuit including a first device, a second device and a conductor external to the first device and the second device, attaching to the first device and the second device at separated points, the tester comprising:
   a first set of terminals and a second set of terminals;
   a signal source for generating a dynamic signal;
   a first set of leads connectable at respective first ends to the separated points of the circuit and connectable at respective second ends to the first set of terminals;
   a second set of leads connectable at respective first ends to the separated points of the circuit and connectable at respective second ends to the second set of terminals;
   a data storage device for storing at least one test parameter; and
   a data processor, coupled to the data storage device and the signal source, configured to perform the steps of:
   controlling application of the dynamic signal to the separated points of the circuit via the first set of terminals;
   obtaining a response signal from the second set of terminals representing a response of the circuit between the separated points to the applied dynamic signal;
   determining a dynamic parameter of the circuit between the separated points as a function of the dynamic signal;
   accessing the at least one test parameter stored in the data storage device;
   calculating a value related to the characteristics of the conductor between the separated points, wherein the calculated value is a function of the at least one test parameter and the determined dynamic parameter; and generating a result related to the characteristics of the conductor according to the calculated value.

2. The tester of claim 1, wherein the dynamic parameter is selected from a group consisting of the impedance, the conductance, the resistance and the admittance of the circuit between the separated points.

3. The tester of claim 1, wherein:

the at least one test parameter includes a plurality of test parameters; and for each of the plurality of test parameters, the data processor is configured to generate a respective test result representing characteristics of the circuit between the separated points as a function of each of the plurality of test parameters and the determined dynamic parameter.

4. The tester of claim 1, wherein:

the at least one test parameter includes a plurality of test parameters; and the data processor is configured to perform the steps of:

receiving a user selection of one of the plurality of the tester parameters; and generating the test result representing characteristics of the circuit between the separated points as a function of the selected one of the plurality of test parameters and the determined dynamic parameter.

5. The tester of claim 4 further comprising an input device, coupled to the data processor, for receiving the user selection.

6. The tester of claim 1, wherein the at least one test parameter is pre-stored in the data storage device or obtained from a measurement previously performed by the tester.

7. The tester of claim 1, wherein the at least one test parameter is a current flowing through the circuit between the separated points.

8. The tester of claim 7 further comprising a non-contact current sensor coupled to the data processor, for measuring the current; and the data processor is configured to control storing of the measured current in the data storage device.

9. The tester of claim 8, wherein the non-contact current sensor is a hall effect current sensor.

10. The tester of claim 1, wherein:

the dynamic parameter represents the impedance of the circuit between the separated points;

the dynamic signal is an AC signal;

the test parameter represents a current; and the test result represents a voltage across the separated points calculated based on the current and the impedance.

11. The tester of claim 1 further comprising a display coupled to the data processor for displaying the test result.

12. The tester of claim 1, wherein the data processor is further configured to performed the steps of:

accessing specification data from the data storage device or a remote data storage device coupled to the tester through a data link, wherein the specification data relates to the specification value corresponding to the circuit;

comparing the test result with the accessed specification data; and generating a diagnostic result based on a result of the comparing step.

13. The tester of claim 12, wherein the specification value corresponds to the test parameter.

14. The tester of claim 13, wherein:

the dynamic parameter represents the impedance of the circuit between the separated points;

the dynamic signal is an AC signal;

the at least one test parameter is a current;

the test result represents a voltage across the separated points of the circuit corresponding to the test parameter; and the specification data represents a specification voltage value corresponding to the at least one test parameter.

15. In a tester including a signal source for generating a dynamic signal, and a data processor configured to apply the dynamic signal to a circuit via separated points of the circuit, and determine a dynamic parameter of the circuit between the separated points as a function of the dynamic signal applied to the circuit, wherein the circuit includes a first device, a second device and a conductor external to the first device and the second device, attaching to the first device and the second device at the separated points, the improvement comprising:

a data storage device, accessible by the data processor, for storing the determined dynamic parameter and at least one test parameter; and the data processor configured to perform the steps of:

accessing the at least one test parameter stored in the data storage device;

accessing the determined dynamic parameter stored in the data storage device;

calculating a value related to characteristics of the conductor, wherein the calculated value is a function of the at least one test parameter and the determined dynamic parameter; and providing a result related to the characteristics of the conductor according to the calculated value.

16. The method of claim 15, wherein the dynamic parameter is selected from a group consisting of the impedance, the conductance, the resistance and the admittance of the circuit between the separated points.

17. A method for determining characteristics of a circuit, wherein the circuit includes a first device, a second device and a conductor external to the first device and the second device, connecting the first device and the second device at separated points, the method comprising the machine-implemented steps of:

generating a dynamic signal;

applying the dynamic signal to the separated points of the circuit;

determining a response of the circuit between the separated points to the applied dynamic signal;

determining a dynamic parameter of the circuit between the separated points based on the dynamic signal and the determined response;

accessing at least one test parameter;

calculating a value related to the characteristics of the conductor between the separated points, wherein the calculated value is a function of the dynamic parameter of the circuit between the separated points and the at least one test parameter; and providing a result related to the characteristics of the conductor according to the calculated value.

18. The method of claim 17, wherein the at least one test parameter includes a plurality of test parameters.

19. The method of claim 18 further comprising the step of receiving a user selection of one of the plurality of test parameters, wherein the test result is generated as a function of the selected one of the plurality of test parameters and the dynamic parameter of the circuit between the separated points.

20. The method of claim 17, wherein the dynamic parameter is selected from a group consisting of the impedance, the conductance, the resistance and the admittance of the circuit.

21. A method for testing characteristics of a circuit, the method comprising the machine-implemented steps of:
applying an AC signal to the circuit via separated points of the circuit;
obtaining a response signal representing a response of the circuit between the separated points to the applied AC signal;
calculating the impedance of the circuit between the separated points based on the AC signal and the response signal;
storing the impedance of the circuit between the separated points;
accessing a preset test parameter representing a current; and
providing a predicted voltage between the separated points of the circuit in response to the current based on the preset test parameter and the impedance.

22. The method of claim 21 further comprising the steps of:
accessing specification data representing a specification voltage value corresponding to the current;
comparing the calculated voltage with the specification voltage; and
generating a diagnostic result based on a result of the comparing step.

23. The method of claim 22, wherein the step of generating the diagnostic result includes the steps of:
determining a difference between the calculated voltage and the specification voltage value obtained in the comparing step;
accessing threshold data including information related to an acceptable difference;
comparing the difference between the calculated voltage and the specification voltage value with the acceptable difference; and
generating the diagnostic result based on a result of the step of comparing the difference between the calculated voltage and the specification voltage value with the acceptable difference.

24. The method of claim 21 further comprising the step of outputting the diagnostic result.

25. A tester for testing a circuit including a first device, a second device and a conductor external to the first device and the second device, connecting the first device and the second device at separated points, the tester comprising:
a first set of signal coupling means and a second set of signal coupling means;
means for generating a dynamic signal;
a first set of connecting means for connecting the separated points of the circuit to the first set of signal coupling means;
a second set of connecting means for connecting the separated points of the circuit to the second set of signal coupling means;
data storage means for storing at least one test parameter; and
data processing means, coupled to the data storage means and the means for generating the dynamic signal, for performing the steps of:
controlling application of the dynamic signal to the separated points of the circuit via the first set of signal coupling means;
obtaining a response signal from the second set of signal coupling means representing a response of the circuit between the separated points to the applied dynamic signal;
determining a dynamic parameter of the circuit between the separated points as a function of the dynamic signal;
accessing the at least one test parameter stored in the data storage means;
calculating a value related to the characteristics of the conductor between the separated points, wherein the calculated value is a function of the at least one test parameter and the determined dynamic and
generating a result related to the characteristics of the conductor according to the calculated value.

26. The tester of claim 25, wherein the dynamic parameter is selected from a group consisting of the impedance, the conductance, the resistance and the admittance of the circuit between the separated points.

27. The tester of claim 25, wherein:
the at least one test parameter includes a plurality of test parameters; and
for each of the plurality of test parameters, the data processing means is configured to generate a respective test result representing characteristics of the circuit between the separated points as a function of each of the plurality of test parameters and the determined dynamic parameter.

28. The tester of claim 25, wherein:
the at least one test parameter includes a plurality of test parameters; and
the data processing means is further configured to perform the steps of:
receiving a user selection of one of the plurality of the tester parameters; and
generating the test result representing characteristics of the circuit between the separated points as a function of the selected one of the plurality of test parameters and the determined dynamic parameter.

29. The tester of claim 28 further comprising input means for receiving the user selection.

30. The tester of claim 25, wherein:
the dynamic parameter represents the impedance of the circuit between the separated points;
the dynamic signal is an AC signal;
the test parameter represents a current; and
the test result represents a voltage across the separated points calculated based on the current and the impedance.

31. The tester of claim 25 further comprising display means for displaying the test result.

32. The tester of claim 25, wherein the data processing means is further configured to performed the steps of:
accessing specification data related to the circuit from the data storage means or a remote data storage means coupled to the tester through a data link, wherein the specification data includes the specification value;
comparing the test result with the accessed specification data; and
generating a diagnostic result based on a result of the comparing step.

33. The tester of claim 25, wherein:
the dynamic parameter represents the impedance of the circuit between the separated points;

the dynamic signal is an AC signal;
the at least one test parameter is a current;
the test result represents a voltage across the separated points of the circuit corresponding to the test parameter; and
the specification data represents a specification voltage value corresponding to the at least one test parameter.

34. A tester for testing a circuit including a first device, a second device and a conductor external to the first device and the second device, connecting the first device and the second device at separated points, the tester comprising:
at least one first terminal and at least one second terminal;
a signal source for generating a dynamic signal;
a data storage device for storing at least one test parameter; and
a data processor, coupled to the data storage device and the signal source, configured to perform the steps of:
controlling application of the dynamic signal to the separated points via the at least one first terminal;
obtaining a response signal from the at least one second terminal representing a response of the circuit between the separated points to the applied dynamic signal;
determining a dynamic parameter of the circuit between the separated points as a function of the dynamic signal;
accessing the at least one test parameter stored in the data storage device; and
calculating a value related to the characteristics of the conductor between the separated points, wherein the calculated value is a function of the at least one test parameter and the determined dynamic parameter; and
generating a result related to the characteristics of the conductor according to the calculated value.

35. The tester of claim 34, wherein:
the dynamic parameter represents the impedance of the circuit between the separated points;
the dynamic signal is an AC signal;
the test parameter represents a current; and
the test result represents a voltage across the separated points calculated based on the current and the impedance.

36. The tester of claim 34, wherein the data processor is further configured to performed the steps of
accessing specification data related to the circuit from the data storage device or a remote data storage device coupled to the tester through a data link, wherein the specification data includes the specification value;
comparing the test result with the accessed specification data; and
generating a diagnostic result based on a result of the comparing step.

37. The tester of claim 34, wherein the data processor is further configured to perform the steps of:
responsive to the diagnostic result representing that the circuit is abnormal, accessing specification data related to a required dynamic parameter of the circuit;
comparing the determined dynamic parameter of the circuit with the required dynamic parameter; and
determining a condition of the measured dynamic parameter of the circuit based on a result of the step of comparing the determined dynamic parameter of the circuit with the required dynamic parameter.

38. The tester of claim 37, wherein the data processor is further configured to perform the steps of:
responsive to the measured dynamic parameter of the circuit being determined as abnormal, generating an output indicating that the measured dynamic parameter of the circuit is abnormal; and
responsive to the measured dynamic parameter of the circuit being determined as normal, generating an output indicating that the measured dynamic parameter of the circuit is normal.

39. A tester for testing a circuit including a first device, a second device and a conductor external to the first device and the second device, connecting the first device and the second device at separated points, the tester comprising:
first means for coupling signals;
means for generating a dynamic signal;
data storage means for storing at least one test parameter; and
data processing means, coupled to the data storage means and the means for generating the dynamic signal, configured to perform the steps of:
controlling application of the dynamic signal to the separated points via the signal coupling means;
obtaining a response signal from the signal coupling means from the separated points representing a response of the circuit between the separated points to the applied dynamic signal;
determining a dynamic parameter of the circuit between the separated points as a function of the dynamic signal;
accessing the at least one test parameter stored in the data storage means;
calculating a value related to the characteristics of the conductor between the separated points, wherein the calculated value is a function of the at least one test parameter and the determined dynamic parameter; and
generating a result related to the characteristics of the conductor according to the calculated value.

40. The tester of claim 39, wherein:
the dynamic parameter represents the impedance of the circuit between the separated points;
the dynamic signal is an AC signal;
the test parameter represents a current; and
the test result represents a voltage across the separated points calculated based on the current and the impedance.

41. The tester of claim 39, wherein the data processing means is further configured to performed the steps of:
accessing specification data related to the circuit from the data storage device or a remote data storage device coupled to the tester through a data link, wherein the specification data includes the specification value;
comparing the test result with the accessed specification data; and
generating a diagnostic result based on a result of the comparing step.

42. The tester of claim 39, wherein the data processing means is further configured to perform the steps of:
responsive to the diagnostic result representing that the circuit is abnormal, accessing specification data related to a required dynamic parameter of the circuit;
comparing the determined dynamic parameter of the circuit with the required dynamic parameter; and
determining a condition of the measured dynamic parameter of the circuit based on a result of the step of comparing the determined dynamic parameter of the circuit with the required dynamic parameter.

43. The tester of claim 42, wherein the data processing means is further configured to perform the steps of:
responsive to the measured dynamic parameter of the circuit being determined as abnormal, generating an output indicating that the measured dynamic parameter of the circuit is abnormal; and responsive to the measurement dynamic parameter of the circuit being determined as normal, generating an output indicating that the measured dynamic parameter of the circuit is normal.

44. A method for testing a circuit including a first device, a second device and a conductor external to the first device and the second device, connecting the first device and the second device at separated points, the method comprising the steps of:

applying the dynamic signal to the circuit;

obtaining a response signal representing a response of the circuit between the separated points to the applied dynamic signal;

determining a dynamic parameter of the circuit between the separated points as a function of the dynamic signal;

accessing at least one test parameter;

calculating a value related to the characteristics of the conductor between the separated points, wherein the calculated value is a function of the at least one test parameter and the determined dynamic parameter; and providing a result related to the characteristics of the conductor according to the calculated value.

45. The method of claim 44, wherein:

the dynamic parameter represents the impedance of the circuit between the separated points;

the dynamic signal is an AC signal;

the test parameter represents a current; and the test result represents a voltage across the separated points calculated based on the current and the impedance.

46. The method of claim 44 further comprising the steps of:

accessing specification data related to the circuit, wherein the specification data includes the specification value;

comparing the test result with the accessed specification data; and generating a diagnostic result based on a result of the comparing step.

47. The tester of claim 44 further comprising the steps of:

responsive to the diagnostic result representing that the circuit is abnormal, accessing specification data related to a required dynamic parameter of the circuit;

comparing the determined dynamic parameter of the circuit with the required dynamic parameter; and determining a condition of the measured dynamic parameter of the circuit based on a result of the step of comparing the determined dynamic parameter of the circuit with the required dynamic parameter.

48. The tester of claim 47 further comprising the steps of:

responsive to the measured dynamic parameter of the circuit being determined as abnormal, generating an output indicating that the measured dynamic parameter of the circuit is abnormal; and responsive to the measurement dynamic parameter of the circuit being determined as normal, generating an output indicating that the measured dynamic parameter of the circuit is normal.

49. In a tester including a signal source for generating a dynamic signal, and a data processor configured to apply the dynamic signal to a circuit between separated points of the circuit, and determine a dynamic parameter of the circuit as a function of the dynamic signal applied to the circuit, wherein the circuit includes a first device, a second device and a conductor external to the first device and the second device, connecting the first device and the second device at the separated points, the improvement comprising:

a data storage device, accessible by the data processor, for storing the determined dynamic parameter and at least one test parameter; and the data processor configured to perform the steps of:

accessing the at least one test parameter stored in the data storage device;

accessing the determined dynamic parameter stored in the data storage device;

calculating a value related to the characteristics of the conductor between the separated points, wherein the calculated value is a function of the at least one test parameter and the determined dynamic parameter; and generating a result related to the characteristics of the conductor according to the calculated value.

50. The tester of claim 49, wherein:

the at least one test parameter includes a plurality of test parameters; and the data processing means is further configured to perform the steps of:

receiving a user selection of one of the plurality of the tester parameters; and generating the test result as a function of the selected one of the plurality of test parameters and the determined dynamic parameter.

51. A tester for testing a circuit comprising:

at least one first terminal and at least one second terminal;

a signal source for generating a dynamic signal;

a data storage device for storing specification information; and a data processor, coupled to the data storage device and the signal source, configured to perform the steps of:

controlling application of the dynamic signal to the circuit via the at least one first terminal;

obtaining a response signal from the at least one second terminal representing a response of the circuit to the applied dynamic signal;

determining a dynamic parameter of the circuit as a function of the dynamic signal;

accessing the specification information stored in the data storage device;

comparing the specification information and the dynamic parameter; and indicating a connection condition of the circuit based on a result of the comparing step.

52. A tester comprising:

a first set of terminals and a second set of terminals;

a signal source for generating a dynamic signal;

a first set of leads connectable at respective first ends to separated points of a circuit and connectable at respective second ends to the first set of terminals;

a second set of leads connectable at respective first ends to the separated points of the circuit and connectable at respective second ends to the second set of terminals;

a data storage device for storing at least one test parameter; and a data processor, coupled to the data storage device and the signal source, configured to perform the steps of:

controlling application of the dynamic signal to the separated points of the circuit via the first set of terminals;

obtaining a response signal from the second set of terminals representing a response of the circuit between the separated points to the applied dynamic signal;

determining a dynamic parameter of the circuit between the separated points as a function of the dynamic signal;

accessing the at least one test parameter stored in the data storage device;
generating a test result related to the characteristics of the circuit between the separated points as a function of the dynamic parameter and the at least one test parameter, wherein the test result relates to a connection condition of the circuit; and
indicating the connection condition.

53. A method for determining characteristics of a circuit, the method comprising the machine-implemented steps of:
generating a dynamic signal;
applying the dynamic signal to separated points of the circuit;
determining a response of the circuit between the separated points to the applied dynamic signal;
determining a dynamic parameter of the circuit between the separated points based on the dynamic signal and the determined response;
accessing at least one test parameter;
generating a test result related to the characteristics of the circuit as a function of the dynamic parameter of the circuit between the separated points and the at least one test parameter, wherein the test result relates to a connection condition of the circuit; and
providing the connection condition.

54. A tester comprising:
at least one first terminal and at least one second terminal;
a signal source for generating a dynamic signal;
a data storage device for storing at least one test parameter; and
a data processor, coupled to the data storage device and the signal source, configured to perform the steps of:
controlling application of the dynamic signal to a circuit via the at least one first terminal;
obtaining a response signal from the at least one second terminal representing a response of the circuit to the applied dynamic signal;
determining a dynamic parameter of the circuit as a function of the dynamic signal;
accessing the at least one test parameter stored in the data storage device;
generating a test result related to the characteristics of the circuit as a function of the at least one test parameter and the determined dynamic parameter, wherein the test result relates to a connection condition of the circuit; and
providing the connection condition.

55. A method for testing a circuit comprising the steps of:
applying the dynamic signal to the circuit;
obtaining a response signal representing a response of the circuit to the applied dynamic signal;
determining a dynamic parameter of the circuit as a function of the dynamic signal;
accessing at least one test parameter;
generating a test result related to the characteristics of the circuit as a function of the at least one test parameter and the determined dynamic parameter, wherein the test result relates to a connection condition of the circuit; and
indicating the connection condition.

56. The tester of claim 1, wherein the data processor is configured to perform a further step of generating a test result based on the value and a specification value.

57. The tester of claim 15, wherein the data processor is configured to perform a further step of generating a test result based on the value and a specification value.

58. The method of claim 17 further comprising the step of generating a test result based on the value and a specification value.

59. The tester of claim 25, wherein the data processing means further performs the step of generating a test result based on the value and a specification value.

60. The tester of claim 34, wherein the data processor is configured to perform the step of generating a test result based on the value and a specification value.

61. The tester of claim 39, wherein the data processing means is configured to perform the step of generating a test result based on the value and a specification value.

62. The method of claim 44 further comprising the step of generating a test result based on the value and a specification value.

63. The tester of claim 49, wherein the data processor is configured to perform the step of generating a test result based on the value and a specification value.

64. The tester of claim 1, wherein the first device is a battery and the second device is a device other than a battery.

65. The tester of claim 15, wherein the first device is a battery and the second device is a device other than a battery.

66. The method of claim 17, wherein the first device is a battery and the second device is a device other than a battery.

67. The tester of claim 25, wherein the first device is a battery and the second device is a device other than a battery.

68. The tester of claim 34, wherein the first device is a battery and the second device is a device other than a battery.

69. The tester of claim 39, wherein the first device is a battery and the second device is a device other than a battery.

70. The method of claim 44, wherein the first device is a battery and the second device is a device other than a battery.

71. The tester of claim 49, wherein the first device is a battery and the second device is a device other than a battery.

* * * * *